(12) United States Patent  (10) Patent No.: US 7,642,796 B2
Yamamoto et al. (45) Date of Patent: Jan. 5, 2010

(54) CONTROL SYSTEM AND METHOD OF SEMICONDUCTOR INSPECTION SYSTEM

(75) Inventors: Kouichi Yamamoto, Hitachinaka (JP); Shinobu Otsuka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/723,808

(22) Filed: Mar. 22, 2007

(65) Prior Publication Data

US 2007/0170951 A1 Jul. 26, 2007

Related U.S. Application Data

(63) Continuation of application No. 11/062,827, filed on Feb. 23, 2005, now Pat. No. 7,196,533.

(30) Foreign Application Priority Data

Feb. 24, 2004 (JP) ............................. 2004-047567

(51) Int. Cl.
*G01R 31/02* (2006.01)
(52) U.S. Cl. ..................................................... 324/763
(58) Field of Classification Search .................. None
See application file for complete search history.

(56) References Cited

U.S. PATENT DOCUMENTS

| 4,354,268 | A | | 10/1982 | Michel et al. | |
|---|---|---|---|---|---|
| 4,727,450 | A | | 2/1988 | Fachinetti et al. | |
| 4,886,980 | A | * | 12/1989 | Fernandes et al. | ............. 307/64 |
| 5,463,315 | A | | 10/1995 | Grace et al. | |
| 5,796,183 | A | | 8/1998 | Hourmand | |
| 6,043,662 | A | * | 3/2000 | Alers et al. | ................. 324/520 |
| 6,130,813 | A | | 10/2000 | Kates et al. | |
| 6,239,961 | B1 | | 5/2001 | Maroon | |
| 6,406,806 | B1 | * | 6/2002 | Keskula et al. | ................. 429/13 |
| 7,282,944 | B2 | * | 10/2007 | Gunn et al. | ................. 324/771 |
| 2004/0105198 | A1 | * | 6/2004 | Fujii | ........................... 361/18 |
| 2006/0072271 | A1 | | 4/2006 | Jones et al. | |

FOREIGN PATENT DOCUMENTS

| JP | 03-156849 | 7/1991 |
|---|---|---|
| JP | 06-237579 | 8/1994 |

OTHER PUBLICATIONS

"Transistor Technique Special No. 28"; pp. 87-100; c. 1991; CQ Publishing Co., Ltd.

* cited by examiner

*Primary Examiner*—Ha Tran T Nguyen
*Assistant Examiner*—Roberto Velez
(74) *Attorney, Agent, or Firm*—McDermott Will & Emery LLP

(57) ABSTRACT

A control system and method of a semiconductor inspection system are disclosed, wherein the inspection can be conducted without reducing the reliability of measurement even in the case where the supply voltage drops. The control system has a controller, a power supply for a power on-off circuit constituting a switching regulator designed to maintain the output voltage against a supply voltage drop, and a supply voltage drop detector. In the case where a supply voltage drop is detected during the measurement, the measurement is automatically suspended, and after restoring the supply voltage, the measurement is automatically restarted.

5 Claims, 3 Drawing Sheets

CONTROL SYSTEM AND METHOD OF SEMICONDUCTOR INSPECTION SYSTEM

RELATED APPLICATIONS

This application is a continuation of application Ser. No. 11/062,827, filed on Feb. 23, 2005, now U.S. Pat. No. 7,196,533 which in turn claims the benefit of Japanese Application No. 2004-047567, filed on Feb. 24, 2004, the disclosures of which applications are incorporated by reference herein.

BACKGROUND OF THE INVENTION

1. Field of the Invention

The present invention relates to a control system of a semiconductor inspection system using a CD-measurement SEM or the like, or in particular to a control operation against the supply voltage drop.

2. Description of the Related Art

In the semiconductor inspection system using the CD-measurement SEM or the like, various disturbances including the mechanical vibration and the external magnetic field are liable to adversely affect the reliability of the inspection result. To cope with this problem, Japanese Patent No. 2911144 (Patent Document 1), for example, discloses a control method for automatically stopping the measurement whenever a mechanical vibration or an external magnetic field not smaller than a reference value is detected by a detection means.

The reliability of the inspection result is liable to be adversely affected also by the supply voltage drop as well as by the external disturbances. In the case where the supply voltage drops during the measurement, therefore, the reliability of the inspection result may be adversely affected. A supply voltage drop, however, poses not only the problem that the reliability of the inspection result is adversely affected but also the problem that the system itself may be shut down. This point is not dealt with by Patent Document 1.

To obviate the problem that the system itself may be shut down by the supply voltage drop, the conventional system uses an instantaneous voltage drop protector 17 as shown in FIG. 4. The instantaneous voltage drop protector 17 prevents the supply voltage applied to the system from being reduced and the system from being shut down by a supply voltage drop of a short duration. Also, the reliability of the inspection result is not adversely affected. The provision of the instantaneous voltage drop protector 17, however, leads to an increased system cost. In addition, the instantaneous voltage drop protector 17 has large footprints (installation space) and size, resulting in a bulky control system of a semiconductor inspection system.

SUMMARY OF THE INVENTION

In view of the problem described above, the object of this invention is to provide a control system of a semiconductor inspection system, which is inexpensive and requires no large space as compared with the conventional method using the instantaneous voltage drop protector and in which the inspection can be conducted without adversely affecting the reliability of measurement even in the case where the supply voltage drops.

According to this invention, there is provided a control system of a semiconductor inspection system, comprising a measurement circuit for electrically processing the measurement data of an object to be inspected, a controller for controlling the measurement operation of the measurement circuit, a power on-off circuit for switching on and off the drive power supplied to the measurement circuit and the controller, a DC power supply for supplying a DC drive power of a constant voltage to the measurement circuit, a first switching regulator for supplying the DC drive power to the controller and a second switching regulator for supplying the DC drive power to the power on-off circuit.

In the control system of a semiconductor inspection system according to this invention, the use of the switching regulators makes it possible to conduct the inspection without shutting down the system, at a lower cost with a smaller installation space than in the prior art, even in the case where the supply voltage drops.

Other objects, features and advantages of the invention will become apparent from the following description of the embodiments of the invention taken in conjunction with the accompanying drawings.

DESCRIPTION OF THE EMBODIMENTS

Figure 1:
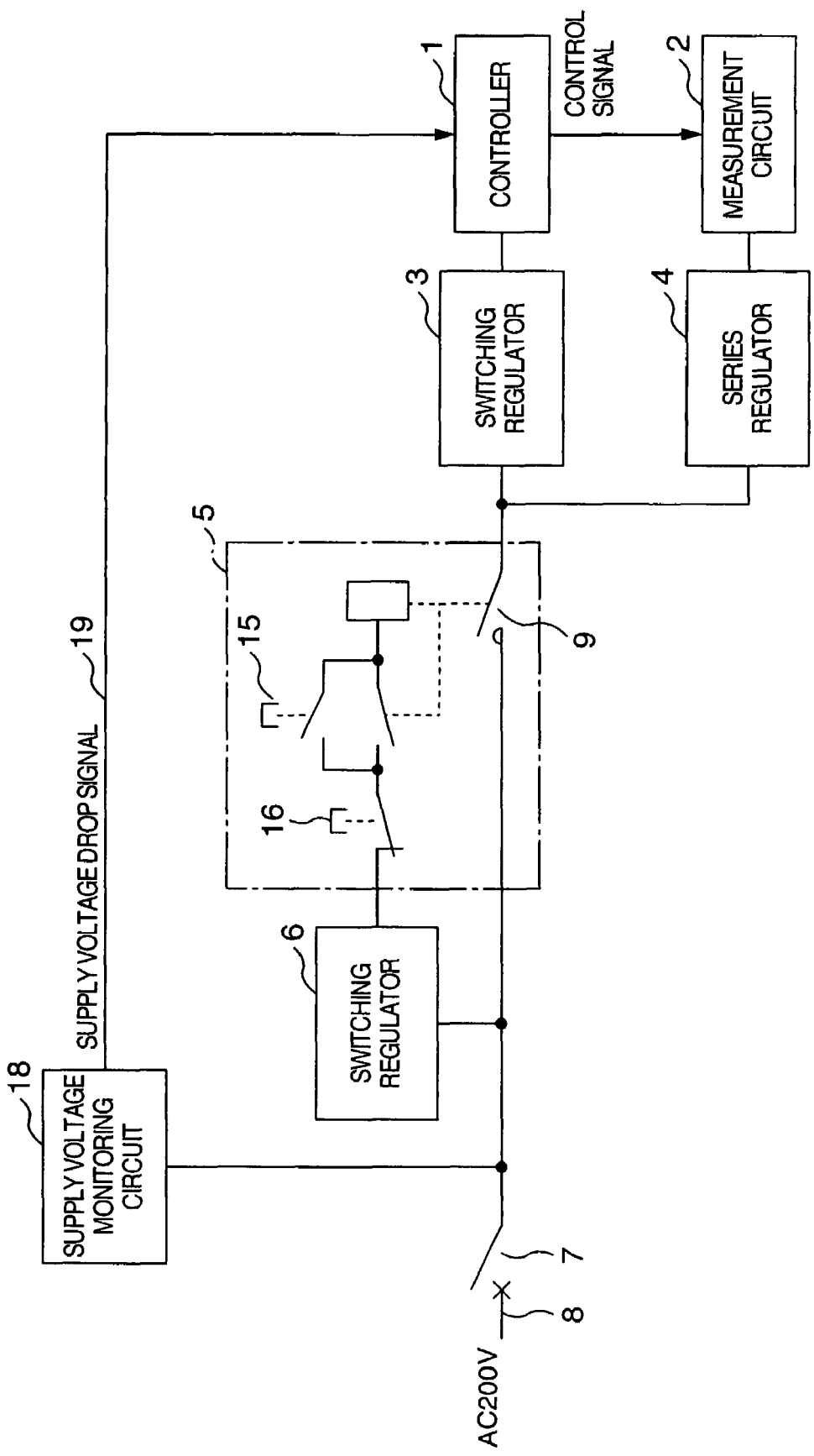
FIG. 1 is a block diagram showing a control system of a semiconductor inspection system according to an embodiment of the invention.

Embodiments of the invention are described below with reference to FIGS. 1, 2, 3 below.

First, a control system of a semiconductor inspection system is explained with reference to the block diagram of FIG. 1. The control system comprises a controller 1 and a measurement circuit 2. The measurement circuit 2 is, for example, a measurement unit of a CD-measurement SEM.

The measurement circuit 2, upon receipt of a control signal from the controller 1, electrically processes the measurement data of an object to be inspected. The drive power for the controller 1 is supplied from an exclusive switching regulator 3. This switching regulator 3 supplies the controller 1 with the alternating current of a power source converted into a direct current of a constant voltage. The switching regulator 3 supplies a direct current of a constant voltage to the controller 1 even in the case where the AC supply voltage drops. This switching regulator 3 is less expensive and smaller than the instantaneous voltage drop protector. Consequently, the installation space required for the control system of a semiconductor inspection system is not substantially increased.

The drive power for the measurement circuit 2 is supplied by a series regulator 4. The series regulator 4 supplies the measurement circuit 2 with the drive power of the alternating current of the power source converted to a direct current of a constant voltage. The series regulator 4 is used as the power source of the measurement circuit 2 to reduce the noises applied to the measurement circuit 2.

Specifically, the measurement circuit of the CD-measurement SEM easily succumbs to and develops a measurement failure due to the electrical noises generated by a chopping system like the switching regulator. The series regular generates no electrical noises, and therefore finds a suitable application as a measurement circuit of the CD-measurement SEM.

The measurement circuit other than that of the CD-measurement SEM not easily affected by the electrical noises requires no series regulator. Nevertheless, the DC power supply for supplying the drive power to the measurement circuit is required. The DC power supply includes the series regulator.

The drive power of the switching regulator 3 and the series regulator 4 is supplied from a power source 8 through a power on-off circuit 5 and a molded-case circuit breaker 7. The drive power of the switching regulator 3 and the series regulator 4 is turned on and off by the on-off operation of the breaker 7.

The power on-off circuit 5 includes an electromechanical contactor 9, an on switch 15 and an off switch 16. The drive power for the power on-off circuit 5 is supplied by an exclusive switching regulator 6. The switching regulator 6 for the power on-off circuit 5 has a similar function to the switching regulator 3 for the controller 1, and is less expensive and smaller than the instantaneous voltage drop protector. As a result, a large installation space is not required for the control system of a semiconductor inspection system.

The switching regulators are described in more detail below.

The switching regulators 3, 6 are designed to maintain a constant DC output voltage against the drop of the supply voltage.

The switching regulators rectify and smooth the alternating voltage and generate a direct voltage by stepping up or down the rectified and smoothed voltage. The switching regulators can be designed to maintain the output voltage by increasing the switching pulse width or frequency even in the case where the AC supply voltage drops. An example is described in "Transistor Gijutsu SPECIAL No. 28, Comprehensive Modern Power Circuit Technologies", 1991, by CQ Publishing Co., Ltd., p. 87. Like a wide input voltage range switching regulator described in this reference adapted to handle the supply voltages of both AC 100 V and AC 200 V continuously, the system can be designed to maintain the output voltage against the input voltage change as wide as AC 90 V to AC 270 V by controlling the pulse width and frequency of the switching operation. Also, as disclosed in JP-A-6-237579, the output holding time can be lengthened by controlling the switching frequency at the time of instantaneous interruption of service.

The switching regulators 3, 6 are each a wide input voltage range switching regulator capable of handling the supply voltages of both AC 100 V and AC 200 V continuously in the input voltage range of AC 85 V to AC 264 V. In this way, the output voltage can be maintained even in the case where the supply voltage drops to 85 V, i.e. 42.5% of the rated voltage.

As long as the output of the switching regulators 3, 6 can be maintained, the inspection can be conducted without shutting down the control system of a semiconductor inspection system.

Next, the supply voltage monitoring circuit is explained.

As described above, as long as the output voltage of the switching regulator 3 for the controller and the output voltage of the switching regulator 6 for the power on-off circuit are maintained, the inspection can be conducted without shutting down the control system of a semiconductor inspection system. Since the tolerable drop range of the supply voltage of the series regulator is smaller than that of the switching regulator, however, a supply voltage, if lower than a critical voltage, may cause an unstable supply of the constant-voltage DC drive power to the measurement circuit 2, and the resulting adverse effect on the measurement circuit 2 may deteriorate the measurement reliability. The supply voltage monitoring circuit is inserted to cope with this problem of deterioration of the measurement reliability.

Specifically, in the case where the supply voltage drops, the output voltage of the series regulator 4 drops within a short time. In the series regulator, the voltage, after being rectified and smoothed the alternating voltage, is stepped down to generate the direct voltage. Once the supply voltage drops below a predetermined voltage (critical voltage), the output voltage drops with the supply voltage. Thus, the output voltage drops within a short time with the drop of the supply voltage.

In the case where the output voltage of the series regulator 4 drops (the supply of the constant-voltage DC drive power becomes unstable), the measurement circuit 2 may be adversely affected to deteriorate the measurement reliability, even though the control system of a semiconductor inspection system may not be shut down in its entirety.

In the case where the supply voltage of the power source 8 drops, therefore, a supply voltage drop detection signal 19 is transmitted to the controller 1 by the supply voltage monitoring circuit 18. The controller 1 is so programmed that, upon detection of a supply voltage drop during the measurement operation, the measurement operation is automatically suspended, and after the supply voltage is restored, the measurement is continued automatically. Then, the reliability of the final inspection result is secured, in spite of the fact that the measurement reliability is affected once by a supply voltage drop. Also, since the switching regulators 3, 6 maintain the output voltage even in the case where the supply voltage drops, the controller 1 operates normally and executes the aforementioned process positively. In this configuration, therefore, the reliability of the final inspection result is not adversely affected even in the case where the supply voltage drops.

The DC power supply for supplying a constant-voltage DC drive power to the measurement circuit 2 is not limited to the series regulator. Even in the case where a DC power supply having a narrow tolerable drop range of the supply voltage like the series regulator is used, the provision of the supply voltage monitoring circuit 18 prevents the reliability of the inspection result from being deteriorated even in the case where the supply voltage drops.

Specifically, once the drop of the supply voltage is detected by the supply voltage monitoring circuit 18 during the measurement, the measurement is automatically suspended, and after the restoration of the supply voltage, the measurement is restarted automatically. Regardless of whether the output voltage of the power source of the measurement circuit 2 can be maintained against the drop of the supply voltage, therefore, the reliability of the inspection result is not adversely affected.

Figure 2:
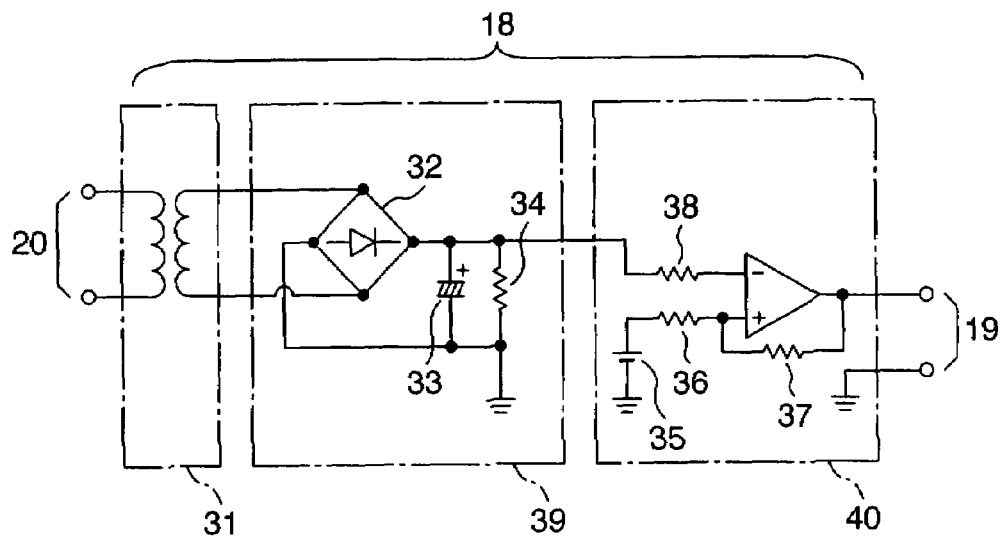
FIG. 2 shows a supply voltage monitoring circuit according to an embodiment of the invention.

FIG. 2 shows a configuration of the supply voltage monitoring circuit 18.

The supply voltage monitoring circuit 18 includes a transformer 31, a rectification and smoothing circuit 39 and a hysteresis comparator 40.

The supply voltage 20 input to the supply voltage monitoring circuit 18 is stepped down through the transformer 31, and rectified and smoothed by the rectification and smoothing circuit 39. The output of the rectification and smoothing circuit 39 is input to the hysteresis comparator 40 to determine whether it is not less than a predetermined voltage. In the case where the output of the rectification and smoothing circuit 39 is lower than the predetermined voltage, a supply voltage drop signal 19 is output. The output of the rectification and smoothing circuit 39 contains a ripple of twice the frequency of the AC power source, and therefore the hysteresis comparator 40 is required to have a hysteresis larger than the ripple width. The threshold (corresponding to the critical voltage) for determining the supply voltage drop in the hysteresis comparator 40 is set to a voltage not lower than the level to which the output voltage of the series regulator 4 drops. In the case where the supply voltage drops and the output voltage of the series regulator 4 is likely to drop, the supply voltage monitoring circuit 18 outputs the supply voltage drop signal 19.

The flowchart for the method of the control operation based on the supply voltage monitoring circuit 18 is explained below.

Figure 3:
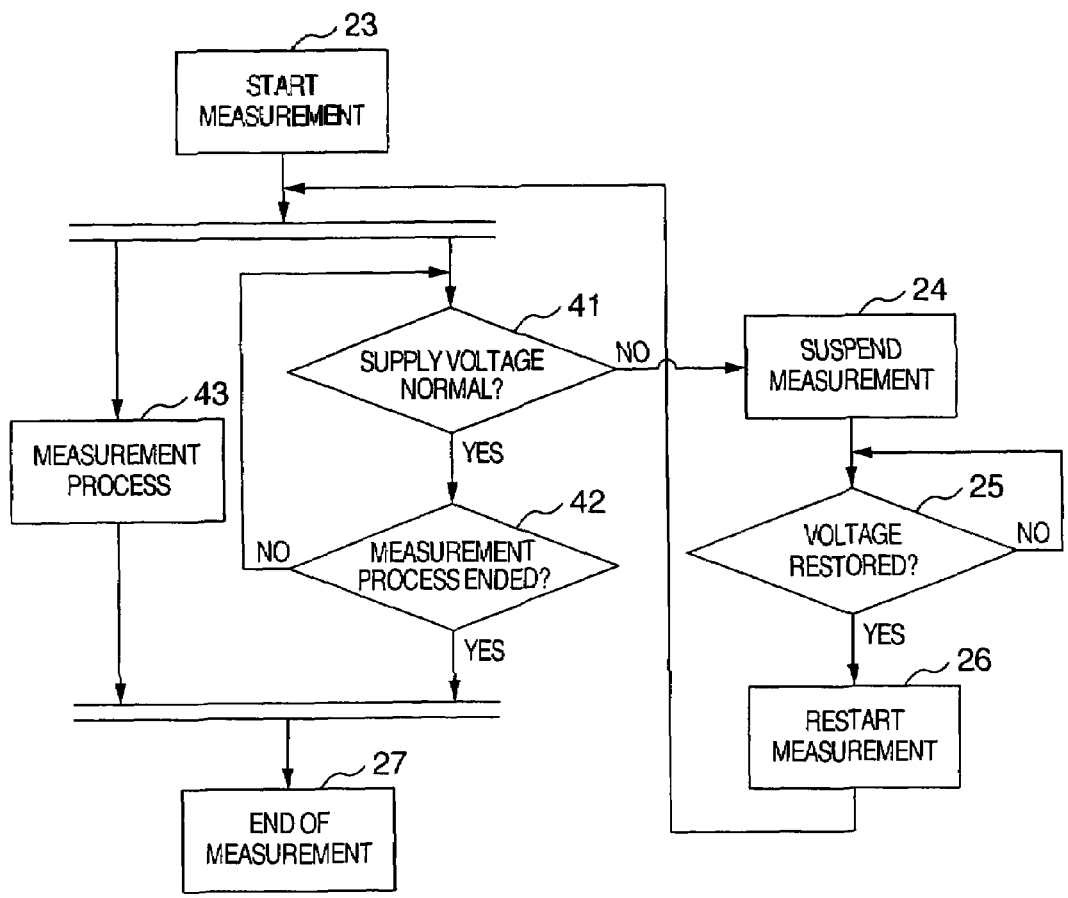
FIG. 3 is a flowchart showing a method of controlling a semiconductor inspection system according to an embodiment of the invention.
Figure 4:
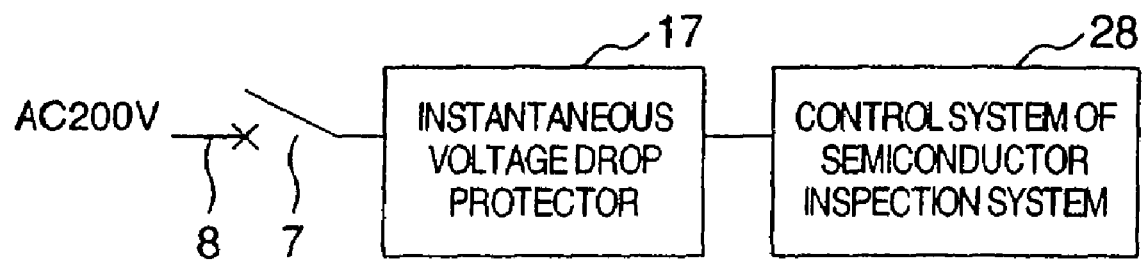
FIG. 4 is a block diagram showing the conventional semiconductor inspection system comprising an instantaneous voltage drop protector.

FIG. 3 is a flowchart showing the method of the control operation performed upon detection of a supply voltage drop according to an embodiment of the invention. After starting the measurement at step 23, the measurement process of step 43 is executed while at the same time determining whether the supply voltage is normal or not at step 41. The determination process at step 41 is repeatedly executed until the measurement process is complete. In the case where the supply voltage is found to be abnormal at step 41, the process proceeds to step 24 where the measurement is suspended. After the measurement is suspended at step 24, the process proceeds to step 25 to wait for the restoration of the supply voltage. In the case where the supply voltage is restored at step 25, the process proceeds to step 26 to restart the measurement. After the measurement is restarted at step 26, the measurement process is again executed at step 43 concurrently with the process of determining whether the supply voltage is normal or not at step 41. In the case where the supply voltage is detected as abnormal again at step 41, the process proceeds again to step 24 to repeat the process shown in the flowchart. Unless the abnormality of the supply voltage is detected during the measurement at step 41, the process proceeds to step 27 thereby to complete the measurement. According to this control method, the measurement is suspended automatically in the case where the supply voltage drops, and the measurement is restarted after the supply voltage is restored. Therefore, the reliability of the inspection result is not adversely affected.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method for operating a control system of a semiconductor measurement apparatus, wherein the apparatus comprises a measurement circuit for electrically processing measurement data of an object to be measured; a controller for controlling a measurement operation of the measurement circuit; a first circuit for supplying a drive power to the measurement circuit based on a drive power from a power source; and a second circuit for supplying a drive power to the controller based on a drive power from the power source, and wherein the method comprises the steps of:

dropping, by the first circuit, a voltage supplied to the measurement circuit with a drop of voltage supplied from the power source to the first circuit, and maintaining, by the second circuit, a voltage supplied to the controller against the drop of voltage supplied from the power source to the second circuit.

2. A control system of a semiconductor measurement apparatus, comprising:

a measurement circuit for electrically processing measurement data of an object to be measured;

a controller for controlling operation of the measurement circuit;

a first circuit for supplying a drive power to the measurement circuit based on a drive power from a power source, wherein the first circuit drops a voltage supplied to the measurement circuit upon a drop of voltage of drive power supplied from the power source to the first circuit; and a second circuit for supplying a drive power to the controller based on a drive power from the power source, the second circuit maintaining a voltage supplied to the controller against a drop of voltage of drive power supplied from the power source to the second circuit.

3. The system of claim 2, wherein:

the first circuit is a series regulator being used as a DC power supply, and the second circuit is a switching regulator being used as a DC power supply.

4. The system of claim 2, wherein the controller stops a measurement operation of the measurement circuit based on the drop of voltage of the drive power supplied from the power source.

5. The system of claim 4, wherein the controller re-starts the measurement operation of the measurement circuit based on detection of restoring of voltage supplied to the controller after the dropping of the voltage of the drive power supplied from the power source.

* * * * *